(12) United States Patent
Zhong et al.

(10) Patent No.: US 11,101,239 B2
(45) Date of Patent: Aug. 24, 2021

(54) PROCESS FOR PACKAGING COMPONENT

(71) Applicant: XIAMEN SANAN OPTOELECTRONICS TECHNOLOGY CO., LTD., Xiamen (CN)

(72) Inventors: Zhibai Zhong, Xiamen (CN); Chia-en Lee, Xiamen (CN); Jinjian Zheng, Xiamen (CN); Lixun Yang, Xiamen (CN); Chen-ke Hsu, Xiamen (CN); Junyong Kang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 16/865,186

(22) Filed: May 1, 2020

(65) Prior Publication Data
US 2020/0258861 A1 Aug. 13, 2020

Related U.S. Application Data

(63) Continuation-in-part of application No. PCT/CN2018/087800, filed on May 22, 2018.

(30) Foreign Application Priority Data

Nov. 2, 2017 (CN) .......................... 201711065564.3

(51) Int. Cl.
*H01L 21/44* (2006.01)
*H01L 23/00* (2006.01)
*H01L 21/56* (2006.01)

(52) U.S. Cl.
CPC ............ *H01L 24/81* (2013.01); *H01L 21/565* (2013.01); *H01L 21/568* (2013.01); *H01L 24/16* (2013.01);
(Continued)

(58) Field of Classification Search
None
See application file for complete search history.

(56) References Cited

U.S. PATENT DOCUMENTS

| 8,722,439 B1* | 5/2014 | Tischler | H01L 24/97 438/29 |
| 2013/0157419 A1* | 6/2013 | Shimizu | H01L 21/56 438/127 |

(Continued)

FOREIGN PATENT DOCUMENTS

| CN | 1505835 A | 6/2004 |
| CN | 108039415 A | 5/2018 |

(Continued)

OTHER PUBLICATIONS

International Search Report for PCT/CN2018/087800 dated Aug. 13, 2018.

*Primary Examiner* — Hung K Vu
(74) *Attorney, Agent, or Firm* — Thomas | Horstemeyer

(57) ABSTRACT

A process for packaging at least one component includes the steps of: a) providing a substrate and a packaging material layer, b) forming the packaging material layer into an adhesively semi-cured packaging material layer, c) adhering the adhesively semi-cured packaging material layer to an array, d) providing a packaging unit including at least one eutectic metal bump pair, e) permitting the eutectic metal bump pair to be in contact with at least one electrode pair on the array, f) subjecting the electrode pair to eutectic bonding to the eutectic metal bump pair, g) encapsulating the component by pressing, h) completely curing the adhesively semi-cured packaging material layer, and i) removing the substrate.

16 Claims, 8 Drawing Sheets

(52) U.S. Cl.
CPC ............ *H01L 2224/16238* (2013.01); *H01L 2224/16502* (2013.01); *H01L 2224/81005* (2013.01); *H01L 2224/8112* (2013.01); *H01L 2224/81805* (2013.01); *H01L 2924/0105* (2013.01); *H01L 2924/01029* (2013.01); *H01L 2924/01047* (2013.01); *H01L 2924/01049* (2013.01); *H01L 2924/01079* (2013.01); *H01L 2924/01083* (2013.01); *H01L 2924/12041* (2013.01); *H01L 2924/13091* (2013.01); *H01L 2924/1461* (2013.01)

(56) References Cited

U.S. PATENT DOCUMENTS

2014/0357020 A1* 12/2014 Aleksov .............. H01L 21/6835
438/107
2016/0035638 A1* 2/2016 Akiba ...................... B32B 3/08
257/790

FOREIGN PATENT DOCUMENTS

| JP | 2003347524 A | 12/2003 |
|----|--------------|---------|
| JP | 2008118161 A | 5/2008 |

* cited by examiner

PROCESS FOR PACKAGING COMPONENT

CROSS-REFERENCE TO RELATED APPLICATION

This application is a bypass continuation-in-part application of International Application No. PCT/CN2018/087800 filed on May 22, 2018, which claims priority of Chinese Patent Application No. 201711065564.3 filed on Nov. 2, 2017. The entire content of each of the international and Chinese patent applications is incorporated herein by reference.

FIELD

The disclosure relates to a process for packaging at least one component, and more particularly to a process for packaging at least one component in semiconductor devices.

BACKGROUND

The micro-component technology is directed to formation of an array of micro-sized components, which are integrated with high density, on a substrate. At present, the micro light-emitting diode (referred to as micro LED hereinafter) technology has gradually become a highly researched area, and industry players are expecting high-quality micro-components to enter the market. The high-quality micro LEDs are anticipated to have a profound effect on conventional display products such as liquid crystal displays (LCDs) and organic light-emitting diodes (OLEDs) which are available in the market.

In the process for packaging the micro-components, the micro-components are formed on a donor wafer, and are then transferred to an acceptor wafer. The acceptor wafer may be, for example, a display screen. One of the difficulties in the process is how to transfer the micro-components from the donor wafer to the acceptor wafer.

A conventional method for transferring the micro-components involves transferring the micro-components from the donor wafer to the acceptor wafer by a wafer bonding process. An example of the method for transferring the micro-components is a direct transfer process. Specifically, an array including the micro-components on the donor wafer is bonded directly to the acceptor wafer, and the donor wafer is then removed from the array via stripping or etching. However, an epitaxial layer might be sacrificed by the direct transfer process. Another example of the method for transferring the micro-components is an indirect transfer process. Specifically, an array including the micro-components is picked up by a transfer medium so as to be bonded to the acceptor wafer, and the transfer medium is then removed from the array. However, the transfer medium used for the indirect transfer process is required to have high temperature resistance.

The techniques used for transferring the micro-components include Van der Waals force transferring, electrostatic adsorption, phase change transferring, and laser beam ablation. Among them, the Van der Waals force transferring, the electrostatic adsorption, and the laser beam ablation are highly developed in the art. Each of these techniques has its own advantages and disadvantages in various applications. The micro-components should be packaged completely after being transferred. A fluid material is usually used for packaging the micro-components, and is then cured.

Silica gel is a packaging material commonly used for packaging the micro-components. Silica gel has been widely used as a packaging material in high-end product applications due to its excellent properties in atmospheric aging resistance, ultraviolet aging resistance, etc. For example, silica gel can withstand an instantaneous high temperature in a short time period. Since the micro-components may be inefficient to package the micro-components individually due to their small size, they are usually packaged entirely at the same time. However, when the micro-components are packaged by covering them with a packaging fluid material such as silica gel, the gaps among the micro-components may not be filled completely with the packaging fluid material. The products thus made may have defects, thereby affecting the reliability thereof.

In view of the aforesaid shortcomings of the prior art, it is necessary to provide a simple process for packaging micro-components.

SUMMARY

An object of the disclosure is to provide a process for packaging at least one component to simplify conventional packaging processes and to alleviate or eliminate the product defect.

According to the disclosure, there is provided a process for packaging at least one component. The process includes the steps of:

a) providing a multi-layered structure, which includes a substrate and a packaging material layer;

b) subjecting the packaging material layer to a semi-curing treatment at a first temperature that is lower than a complete curing temperature of the packaging material layer so as to form an adhesively semi-cured packaging material layer;

c) subjecting the adhesively semi-cured packaging material layer of the multi-layered structure to adhesion to an array, which includes the at least one component and at least one electrode pair disposed on the at least one component, so as to permit the at least one component to be mounted adhesively on the adhesively semi-cured packaging material layer;

d) providing a packaging unit, which includes a packaging substrate and a patterned eutectic metal layer, the patterned eutectic metal layer being disposed on the packaging substrate and having at least one eutectic metal bump pair;

e) permitting the at least one eutectic metal bump pair to be aligned and in contact with the at least one electrode pair;

f) subjecting the at least one eutectic metal bump pair to an eutectic bonding treatment at a second temperature so as to permit the at least one electrode pair to eutectically bond the at least one eutectic metal bump pair while the adhesively semi-cured packaging material layer is maintained in a semi-cured state;

g) subjecting the multi-layered structure and the packaging unit to pressing toward each other so as to permit the adhesively semi-cured packaging material layer to encapsulate the at least one component;

h) subjecting the adhesively semi-cured packaging material layer to a complete curing treatment; and i) removing the substrate.

In the process for packaging at least one component according to the disclosure, the adhesively semi-cured packaging material layer is used as a transfer medium for picking up the at least one component and also as a packaging material. Therefore, the process for packaging at least one component according to the disclosure can be implemented relatively simply. In addition, the at least one component is packaged with the adhesively semi-cured packaging material layer by subjecting the multi-layered structure and the packaging unit to pressing toward each other, such that the at least one component may be encapsulated completely by the adhesively semi-cured packaging material layer and the gaps among the component may be filled completely with the adhesively semi-cured packaging material layer. Therefore, the packaging quality can be enhanced and the reliability of the products thus made can be increased.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that some components are exaggeratedly shown in the figures for the purpose of convenient illustration and are not in scale.

Figure 1:
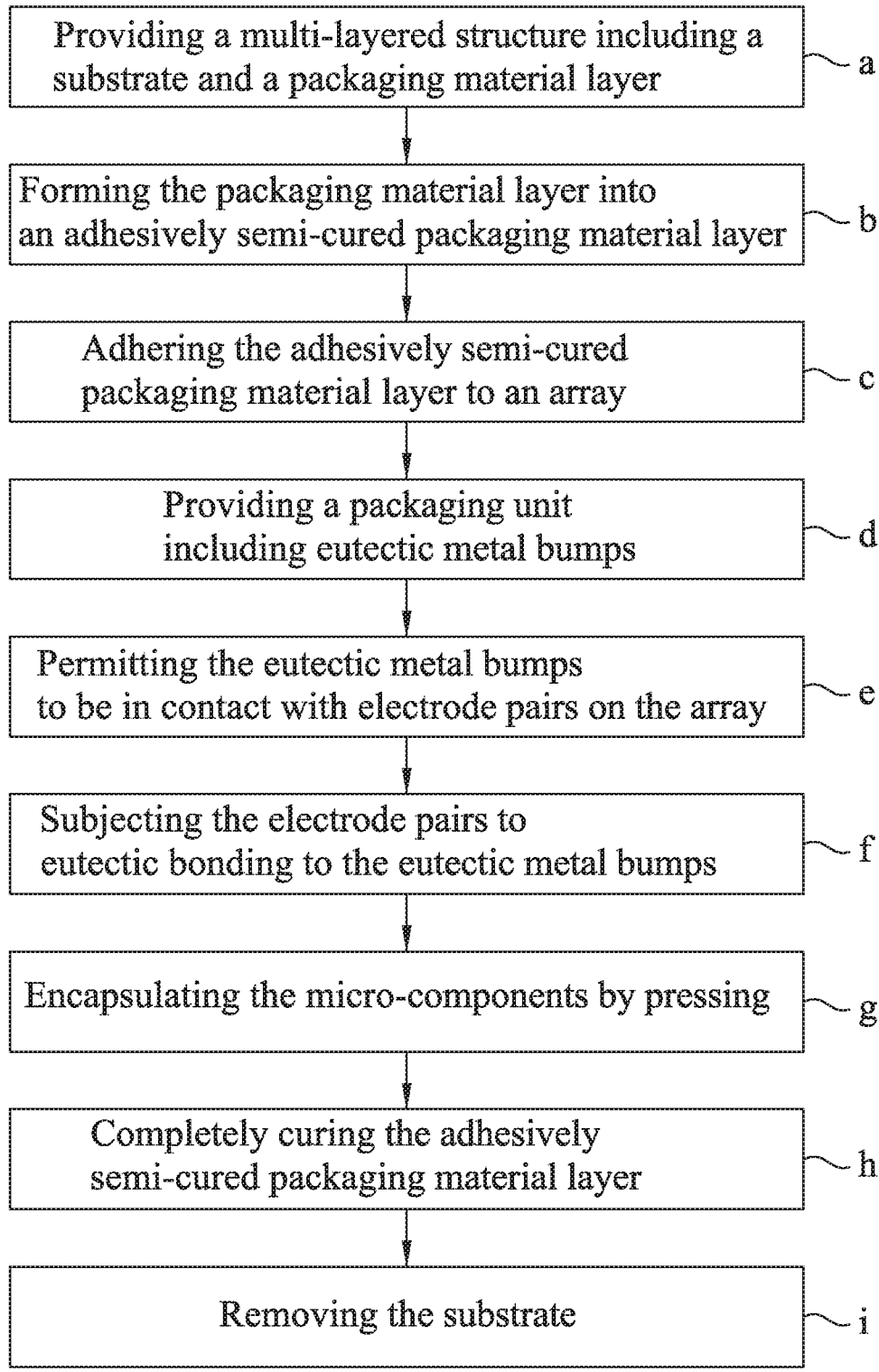
FIG. 1 is a flow diagram of a process for packaging at least one component according to the disclosure.
Figure 8:
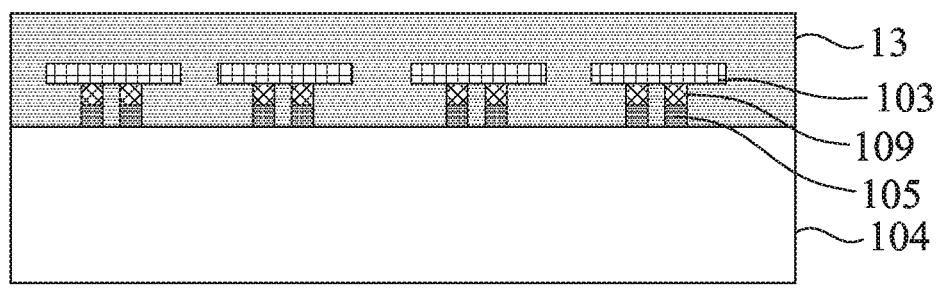

Referring to FIGS. 1 and 8, a first embodiment of a process for packaging at least one component according to the disclosure includes the steps of:

a) providing a multi-layered structure 100, which includes a substrate 101 and a packaging material layer 102;

b) subjecting the packaging material layer 102 to a semi-curing treatment at a first temperature that is lower than a complete curing temperature of the packaging material layer 102 so as to form an adhesively semi-cured packaging material layer 108;

c) subjecting the adhesively semi-cured packaging material layer 108 of the multi-layered structure 100 to adhesion to an array 11, which includes a plurality of components 103 spaced apart from one another and a plurality of electrode pairs 109 disposed on the components 103, respectively, so as to permit the components 103 to be mounted adhesively on the adhesively semi-cured packaging material layer 108;

d) providing a packaging unit 12, which includes a packaging substrate 104 and a patterned eutectic metal layer 121, the patterned eutectic metal layer 121 being disposed on the packaging substrate 104 and having a plurality of eutectic metal bump pairs 105 spaced apart from one another;

e) permitting the eutectic metal bump pairs 105 to be aligned and in contact with the electrode pairs 109, respectively;

f) subjecting the eutectic metal bump pairs 105 to an eutectic bonding treatment at a second temperature so as to permit the electrode pairs 109 to eutectically bond the eutectic metal bump pairs 105, respectively, while the adhesively semi-cured packaging material layer is maintained in a semi-cured state;

g) subjecting the multi-layered structure 100 and the packaging unit 12 to pressing toward each other so as to permit the adhesively semi-cured packaging material layer 108 to encapsulate the electrode pairs 109 and the components 103;

h) subjecting the adhesively semi-cured packaging material layer 108 to a complete curing treatment; and i) removing the substrate 101.

Figure 2:
FIGS. 2 to 8 are schematic views illustrating consecutive steps of a first embodiment of the process for packaging at least one component according to the disclosure.
Figure 3:
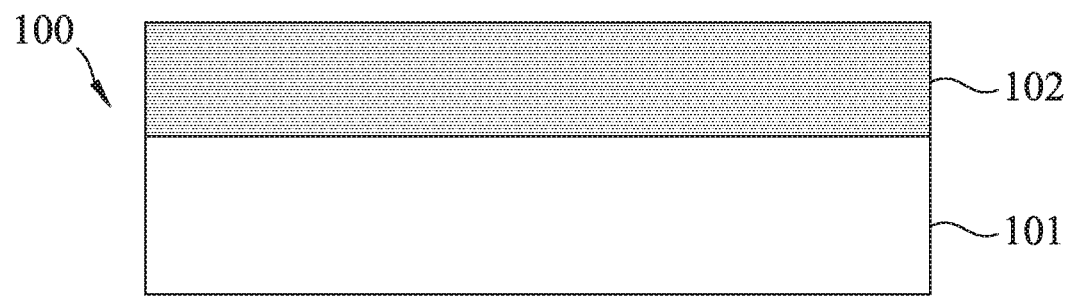

Referring specifically to FIGS. 2 and 3, in step a) of the first embodiment, the packaging material layer 102 is mounted directly on the substrate 101. A non-limiting example of the substrate 101 suitably used in the first embodiment is a stainless steel substrate, which can be separated easily from the packaging material layer 102 in step i).

The packaging material layer 102 has a thickness ranging from 15 μm to 100 μm, and is made of silica gel, which has a complete curing temperature usually ranging from 150° C. to 200° C. Complete curing of the silica gel will take a time period ranging from about 30 minutes to about 120 minutes at the complete curing temperature. Silica gel can be applied on the substrate 101 by, for example, spin coating.

Figure 4:
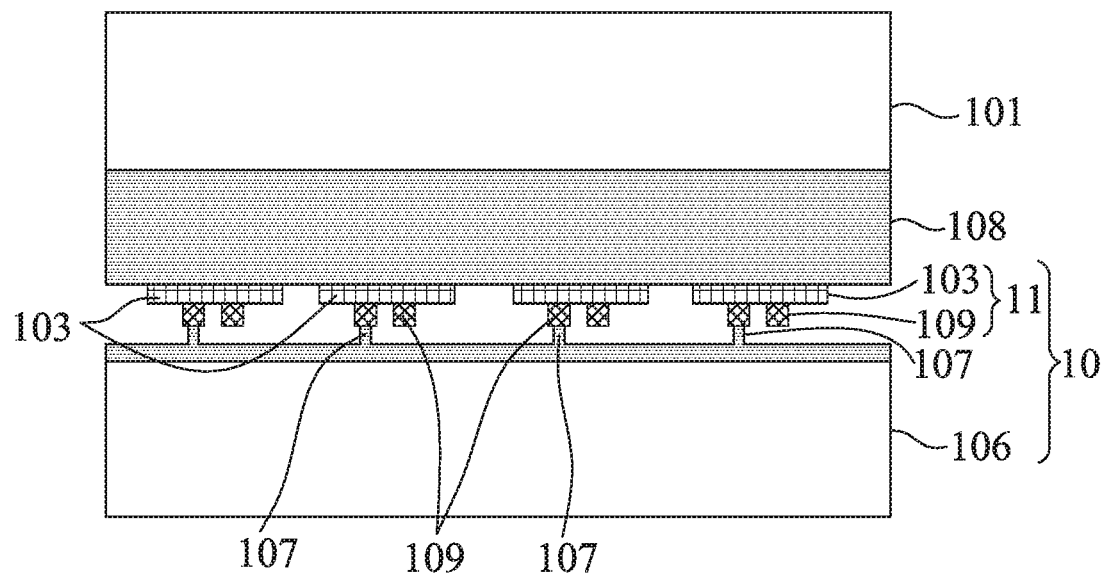

Referring specifically to FIG. 4, in step b), when the packaging material layer 102 is made of silica gel, since silica gel has the complete curing temperature usually ranging from 150° C. to 200° C., as described above, the first temperature at which the packaging material layer 102 is subjected to the semi-curing treatment is at least 60° C. and less than 150° C. (for example, 80° C., 100° C., or 120° C.). The packaging material layer 102 is subjected to the semi-curing treatment at the first temperature for a time period of, for example, at least 10 minutes and less than 30 minutes.

Figure 5:
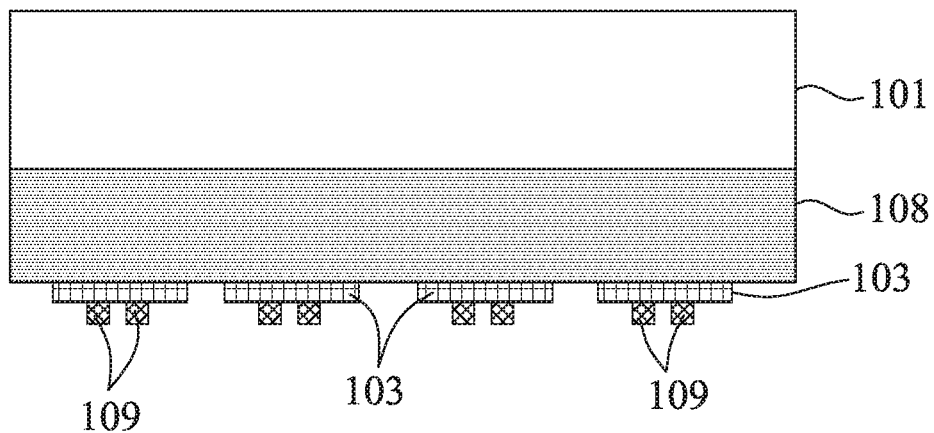

Referring specifically to FIGS. 4 and 5, in step c), a suspending structure 10 including the array 11 is provided so as to permit the array 11 to be picked up adhesively by the adhesively semi-cured packaging material layer 108. Specifically, the suspending structure 10 further includes a supporting layer 106 and a plurality of stabilizing posts 107 disposed on the supporting layer 106 and spaced apart from one another, such that the components 103 are supported on the supporting layer 106 via the stabilizing posts 107.

It should be noted that the contact area between each of the stabilizing posts 107 and a corresponding one electrode of the electrode pairs 109 may be as small as possible and the adhesion between the stabilizing posts 107 and the array 11 may be as low as possible as long as the components 103 can be supported stably on the supporting layer 106 via the stabilizing posts 107, so as to permit the array 11 to be separated easily from the stabilizing posts 107 in step c), such that the components 103 can be mounted adhesively on the adhesively semi-cured packaging material layer 108.

Examples of the components 103 may include, but are not limited to, micro light-emitting diodes (micro LEDs), metal oxide semiconductors (MOSs), and micro-electromechanical systems (MEMSs). The electrode pairs 109 may be gold (Au) electrode pairs.

Figure 6:
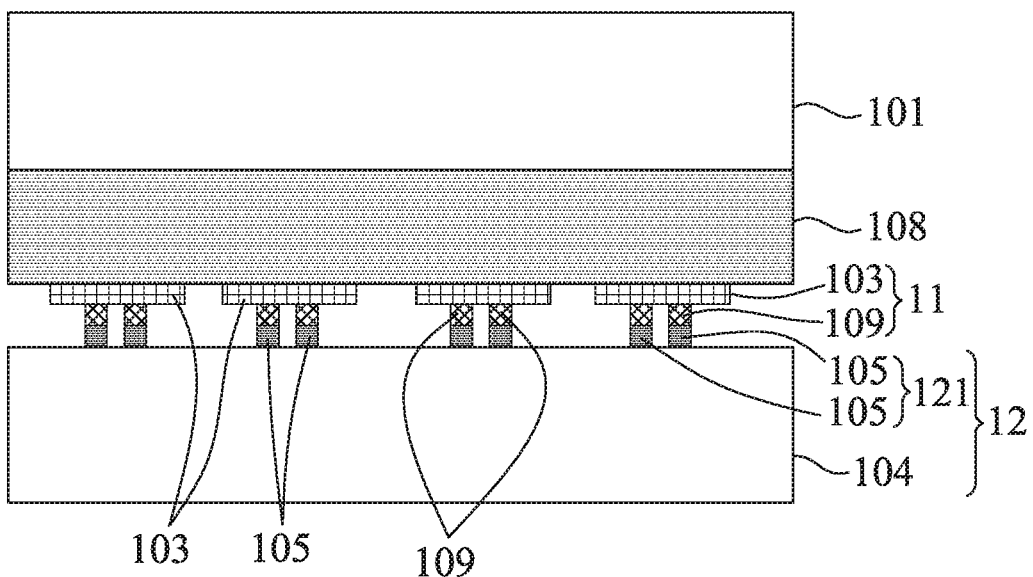

Referring specifically to FIG. 6, as described above, in step d), the packaging unit 12 is provided and includes the packaging substrate 104 and the patterned eutectic metal layer 121. The patterned eutectic metal layer 121 is disposed on the packaging substrate 104 and has a plurality of eutectic metal bump pairs 105 spaced apart from one another. In addition, the packaging material layer 102 has a thickness larger than a total thickness of the array 11 and the patterned eutectic metal layer 121.

As described above, in step e), the eutectic metal bump pairs 105 are permitted to be aligned and in contact with the electrode pairs 109, respectively. In step f), the eutectic metal bump pairs 105 are subjected to the eutectic bonding treatment at the second temperature so as to permit the electrode pairs 109 to eutectically bond the eutectic metal bump pairs 105, respectively, while the adhesively semi-cured packaging material layer 108 is maintained in the semi-cured state.

The eutectic metal bump pairs 105 are made of a metal material selected from the group consisting of a silver-tin-copper alloy, a gold-tin alloy, and a combination thereof, and the second temperature is at most 350° C. (for example, ranging from 150° C. to 350° C.). In the first embodiment, the eutectic metal bump pairs 105 are made of the silver-tin-copper alloy.

During the eutectic bonding treatment in step f), the eutectic metal bump pairs 105 are heated to an eutectic temperature (i.e., the second temperature) in a short time period. The eutectic temperature usually ranges from 150° C. to 350° C., and the eutectic bonding treatment is implemented for a time period of at most 1 minute. The adhesively semi-cured packaging material layer 108 is maintained in the semi-cured state at a temperature of at most 350° C. during a heating time period of at most 1 minute.

Figure 7:
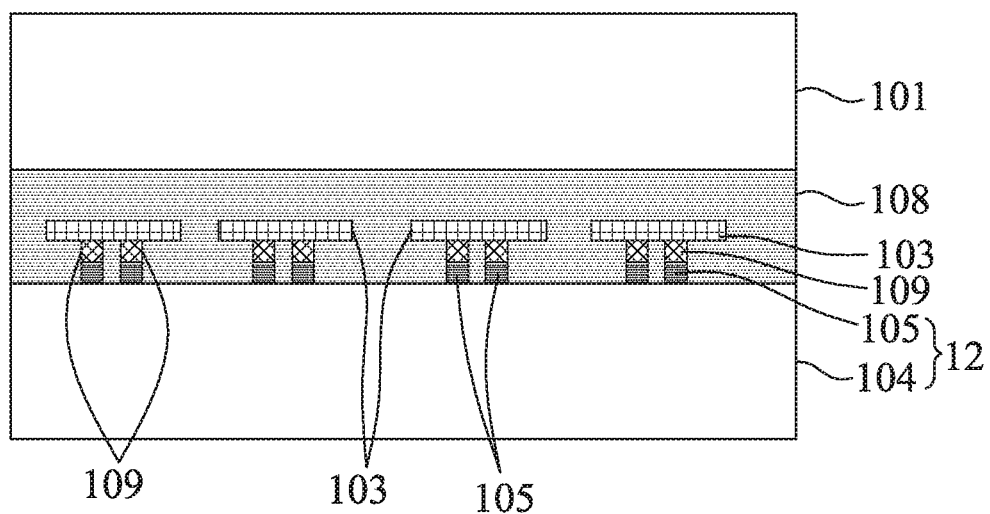

Referring specifically to FIG. 7, in step g), the multi-layered structure 100 and packaging unit 12 are pressed toward each other by vacuum pressing to permit the components 103 to be encapsulated completely by the adhesively semi-cured packaging material layer 108 and to permit the gaps among the components 103 to be filled completely with the adhesively semi-cured packaging material layer 108.

In step h), the adhesively semi-cured packaging material layer 108 is subjected to the complete curing treatment at the complete curing temperature ranging from 150° C. to 200° C.

Referring specifically to FIG. 8, in step i), the substrate 101, which is the stainless steel substrate in the first embodiment, is removed by stripping the stainless steel substrate directly from the packaging material layer 102 which is cured completely.

In the first embodiment, the adhesively semi-cured packaging material layer 108 is used as a transfer medium for picking up the components 103 and also as a packaging material. Therefore, the first embodiment can be implemented simply. In addition, the components 103 are packaged with the adhesively semi-cured packaging material layer 108 by subjecting the multi-layered structure 100 and the packaging unit 12 to pressing toward each other, such that the components 103 may be encapsulated completely by the adhesively semi-cured packaging material layer 108 and the gaps among the components 103 may be filled completely with the adhesively semi-cured packaging material layer 108. Therefore, the packaging quality is enhanced and the reliability of the products thus made is increased. Furthermore, since the eutectic metal bump pairs 105 can be heated to the eutectic temperature in a short time period so as to implement the eutectic bonding treatment, the adhesively semi-cured packaging material layer 108 can be maintained stably in the semi-cured state.

Referring to FIGS. 9 to 16, a second embodiment of the process for packaging at least one component according to the disclosure is similar to the first embodiment except for the following differences.

Figure 9:
FIGS. 9 to 16 are schematic views illustrating consecutive steps of a second embodiment of the process for packaging at least one component according to the disclosure.
Figure 10:
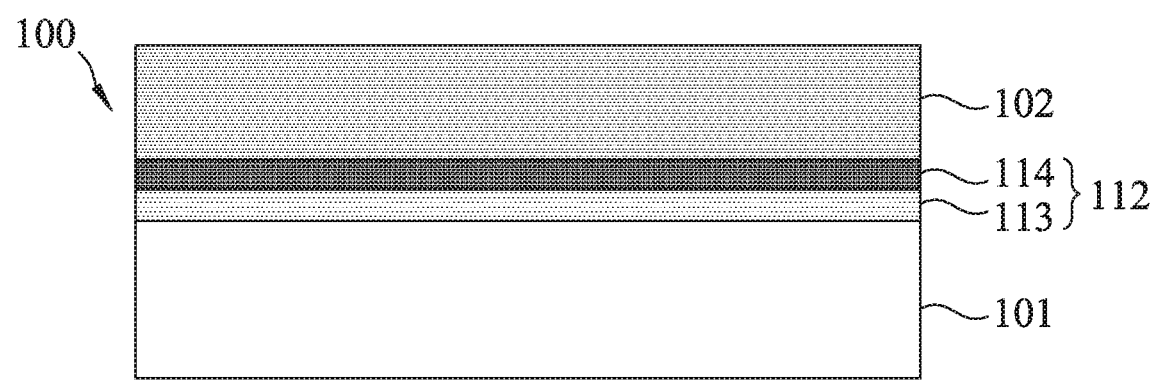
Figure 11:
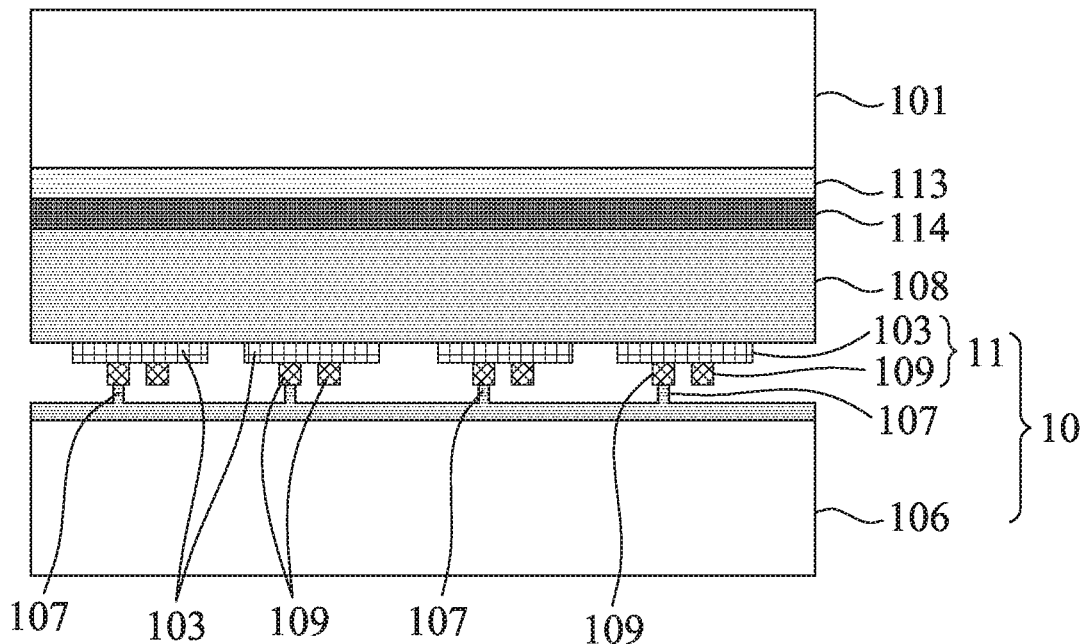
Figure 12:
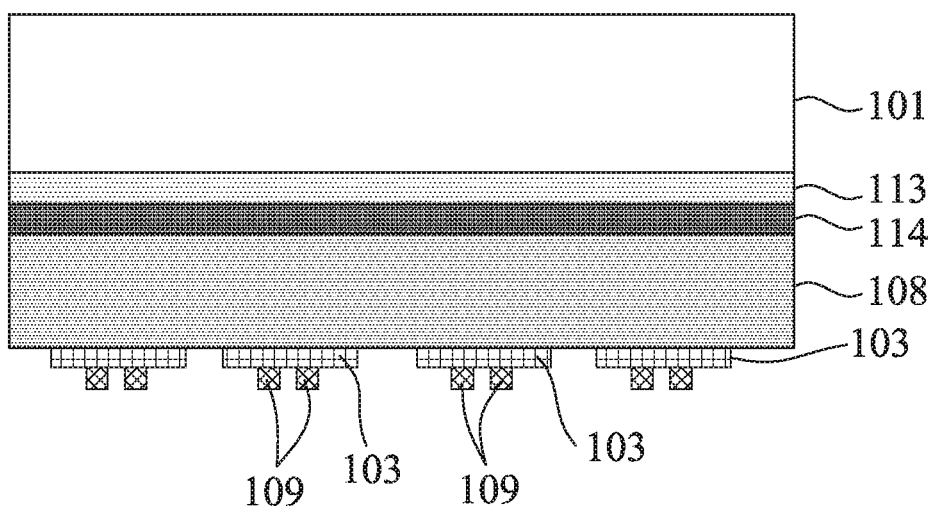
Figure 13:
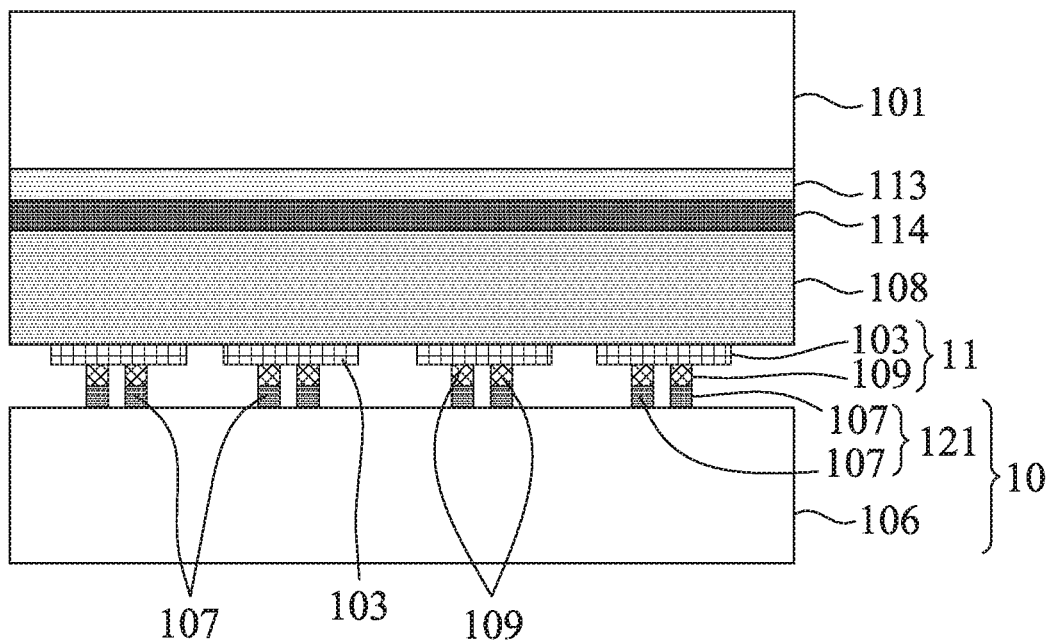
Figure 14:
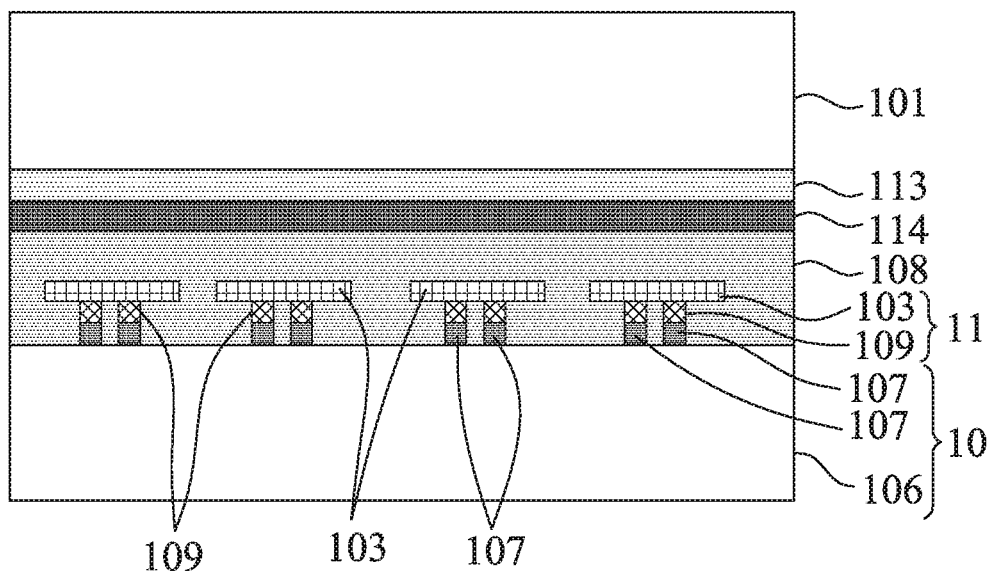
Figure 15:
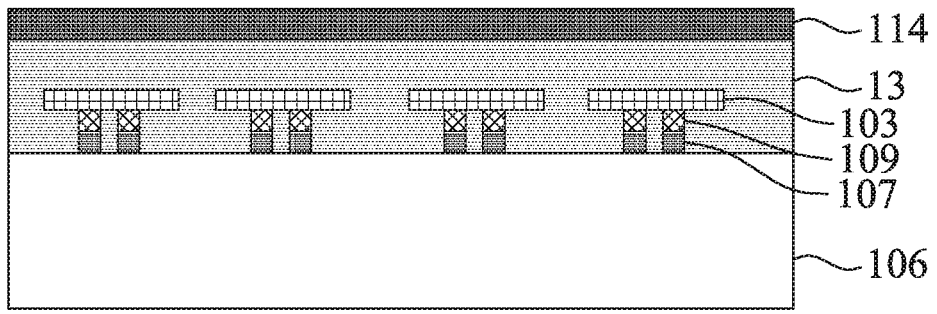
Figure 16:
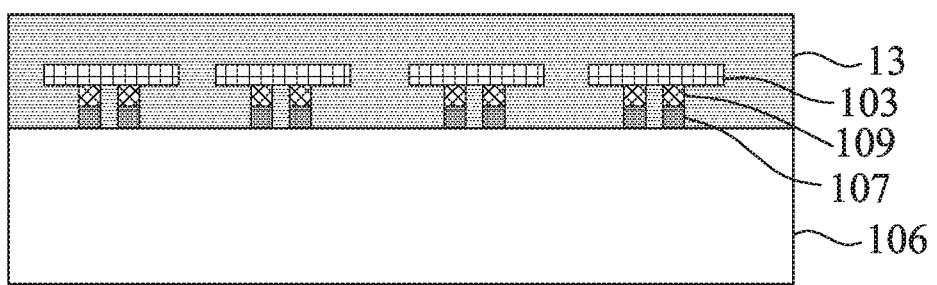

Referring specifically to FIGS. 9 and 10, in step a) of the second embodiment, in addition to the substrate 101 and the packaging material layer 102, the multi-layered structure 100 further includes a sacrificing layer unit 112. The sacrificing layer unit 112 is sandwiched between the substrate 101 and the packaging material layer 102, and includes a stripping layer 113 proximate to the substrate 101 and a protecting layer 114 proximate to the packaging material layer 102.

In the second embodiment, a non-limiting example of the substrate 101 is a sapphire substrate, a non-limiting example of the stripping layer 113 is a gallium nitride layer, and a non-limiting example of the protecting layer 114 is a indium tin oxide layer. The gallium nitride layer and the indium tin oxide layer may be formed sequentially on the sapphire substrate by chemical vapor deposition, sputtering, or the like.

In step f) of the second embodiment, the eutectic metal bump pairs 105 are made of a metal material selected from the group consisting of indium metal, a bismuth-tin alloy, and a combination thereof, and the second temperature (the eutectic temperature) for the eutectic bonding treatment is at most the complete curing temperature of the packaging material layer 102. For example, the eutectic bonding treatment is implemented at the eutectic temperature of at most 180° C. for a time period of at most 1 minute. The adhesively semi-cured packaging material layer 108 is maintained in the semi-cured state during implementation of the eutectic bonding treatment.

Step i) of the second embodiment is implemented by subjecting the stripping layer 113 to laser irradiation to remove the substrate 101 from the protecting layer 114, and then subjecting the protecting layer 114 to wet etching to remove the protecting layer 114 from the packaging material layer 102 which is cured completely. The protecting layer 114 is used to protect the packaging material layer 102 from damage when the stripping layer 113 is subjected to the laser irradiation for removing the substrate 101. The protecting layer 114 is made of metal oxide, and may be removed by the wet etching using an acid etchant or a base etchant.

In the second embodiment, the adhesively semi-cured packaging material layer 108 is used as a transfer medium for picking up the components 103 and also as a packaging material. Therefore, the second embodiment can be implemented simply. In addition, the components 103 are packaged with the adhesively semi-cured packaging material layer 108 by subjecting the multi-layered structure 100 and the packaging unit 12 to pressing toward each other, such that the components 103 may be encapsulated completely by the adhesively semi-cured packaging material layer 108 and the gaps among the components 103 may be filled completely with the adhesively semi-cured packaging material layer 108. Therefore, the packaging quality is enhanced and the reliability of the products thus made is increased. Furthermore, since the eutectic metal bump pairs 105 are subjected to the eutectic bonding treatment at the eutectic temperature which is at most the complete curing temperature of the packaging material layer 102, the adhesively semi-cured packaging material layer 108 can be stably maintained in the semi-cured state. Furthermore, since the sacrificing layer unit 112 is included in the multi-layered structure 100, the completely cured packaging material layer 103 can maintain integrity thereof after the sacrificing layer unit 112 is removed.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A process for packaging at least one component, comprising the steps of:
    a) providing a multi-layered structure, which includes a substrate and a packaging material layer;
    b) subjecting the packaging material layer to a semi-curing treatment at a first temperature that is lower than a complete curing temperature of the packaging material layer so as to form an adhesively semi-cured packaging material layer;
    c) subjecting the adhesively semi-cured packaging material layer of the multi-layered structure to adhesion to an array, which includes the at least one component and at least one electrode pair disposed on the at least one component, so as to permit the at least one component to be mounted adhesively on the adhesively semi-cured packaging material layer;
    d) providing a packaging unit, which includes a packaging substrate and a patterned eutectic metal layer, the patterned eutectic metal layer being disposed on the packaging substrate and having at least one eutectic metal bump pair;
    e) permitting the at least one eutectic metal bump pair to be aligned and in contact with the at least one electrode pair;
    f) subjecting the at least one eutectic metal bump pair to an eutectic bonding treatment at a second temperature so as to permit the at least one electrode pair to eutectically bond the at least one eutectic metal bump pair while the adhesively semi-cured packaging material layer is maintained in a semi-cured state;
    g) subjecting the multi-layered structure and the packaging unit to pressing toward each other so as to permit the adhesively semi-cured packaging material layer to encapsulate the at least one component;
    h) subjecting the adhesively semi-cured packaging material layer to a complete curing treatment; and
    i) removing the substrate.

2. The process according to claim 1, wherein in step g), the adhesively semi-cured packaging material layer further encapsulates the at least one electrode pair.

3. The process according to claim 1, wherein the packaging material layer includes silica gel, the first temperature is at least 60° C. and less than 150° C., and the complete curing temperature ranges from 150° C. to 200° C.

4. The process according to claim 1, wherein the at least one eutectic metal bump pair is made of a metal material selected from the group consisting of a silver-tin-copper alloy, a gold-tin alloy, and a combination thereof, and the second temperature is at most 350° C.

5. The process according to claim 4, wherein in step f), the eutectic bonding treatment is implemented for a time period of at most 1 minute, and the adhesively semi-cured packaging material layer is maintained in the semi-cured state at a temperature of at most 350° C. during a heating time period of at most 1 minute.

6. The process according to claim 1, wherein in step f), the at least one eutectic metal bump pair is made of a metal material selected from the group consisting of indium metal, a bismuth-tin alloy, and a combination thereof, and the second temperature is at most the complete curing temperature of the packaging material layer.

7. The process according to claim 1, wherein the packaging material layer has a thickness larger than a total thickness of the array and the patterned eutectic metal layer.

8. The process according to claim 1, wherein in step c), a suspending structure including the array is provided so as to permit the array to be picked up adhesively by the adhesively semi-cured packaging material layer.

9. The process according to claim 8, wherein the suspending structure further includes a supporting layer and at least one stabilizing post disposed on the supporting layer, such that the at least one component is supported on the supporting layer via the at least one stabilizing post.

10. The process according to claim 1, wherein step g) is implemented by vacuum pressing to permit the at least one component to be encapsulated completely by the adhesively semi-cured packaging material layer.

11. The process according to claim 10, which is for packaging a plurality of the components, wherein in step g), gaps among the components are filled completely with the adhesively semi-cured packaging material layer.

12. The process according to claim 1, wherein the substrate is a stainless steel substrate, and step i) is implemented by stripping the stainless steel substrate directly from the packaging material layer which is cured completely.

13. The process according to claim 1, wherein in step a), the multi-layered structure further includes a sacrificing layer unit which is sandwiched between the substrate and the packaging material layer.

14. The process according to claim 13, wherein
    the sacrificing layer unit includes a stripping layer proximate to the substrate and a protecting layer proximate to the packaging material layer, and
    step i) is implemented by subjecting the stripping layer to laser irradiation to remove the substrate from the protecting layer and then subjecting the protecting layer to wet etching to remove the protecting layer from the packaging material layer which is cured completely.

15. The process according to claim 14, wherein the substrate includes a sapphire substrate, the stripping layer includes a gallium nitride layer, and the protecting layer includes a indium tin oxide layer.

16. The process according to claim 1, wherein the at least one component is selected from the group consisting of a micro light-emitting diode, a metal oxide semiconductor, and a micro-electromechanical system.

* * * * *